United States Patent [19]

Fleuret

[11] 4,401,844

[45] Aug. 30, 1983

[54] POWER SUPPLY BAR COMPRISING A STACK OF 2 N METAL LAYERS SEPARATED BY 2 N DIELECTRIC LAYERS

[75] Inventor: Daniel Fleuret, Paris, France

[73] Assignee: L.C.C.-C.I.C.E.-Compagnie Europeenne de Composants Electroniques, Bagnolet, France

[21] Appl. No.: 324,608

[22] Filed: Nov. 24, 1981

[30] Foreign Application Priority Data

Nov. 28, 1980 [FR] France ............................. 80 25270

[51] Int. Cl.³ ................................................ H01B 7/00
[52] U.S. Cl. ................................. 174/72 B; 361/309; 361/407
[58] Field of Search .................. 174/68 B, 70 B, 72 B, 174/117 R, 117 F; 361/275, 306, 308, 309, 330, 407

[56] References Cited

U.S. PATENT DOCUMENTS

| | | | |
|---|---|---|---|
| 3,189,847 | 6/1965 | Rymaszewski et al. | 174/117 R X |
| 3,312,870 | 4/1967 | Rhoades | 174/117 R X |
| 3,351,876 | 11/1967 | Conrad | 361/407 X |
| 3,520,987 | 7/1970 | Ohlrich | 174/117 R X |
| 3,778,735 | 12/1973 | Steenmetser | 174/72 B X |
| 4,236,046 | 11/1980 | De Vries | 174/72 B |

*Primary Examiner*—Laramie E. Askin

[57] ABSTRACT

A power supply bar with low characteristic impedance is provided for transmitting an electric signal from a source to a plurality of receivers, the supply bar comprising particularly two conducting bars conveying the signal, separated by a stack of metal-coated dielectric film forming an assembly of 2 n dielectric films, identical or different, separated by 2 n metal layers, the metal layers in even and uneven rows being respectively connected together laterally by electric connections, the conducting bars being fixed on each side of the stack and connected electrically respectively to one of the lateral electric connections.

16 Claims, 7 Drawing Figures

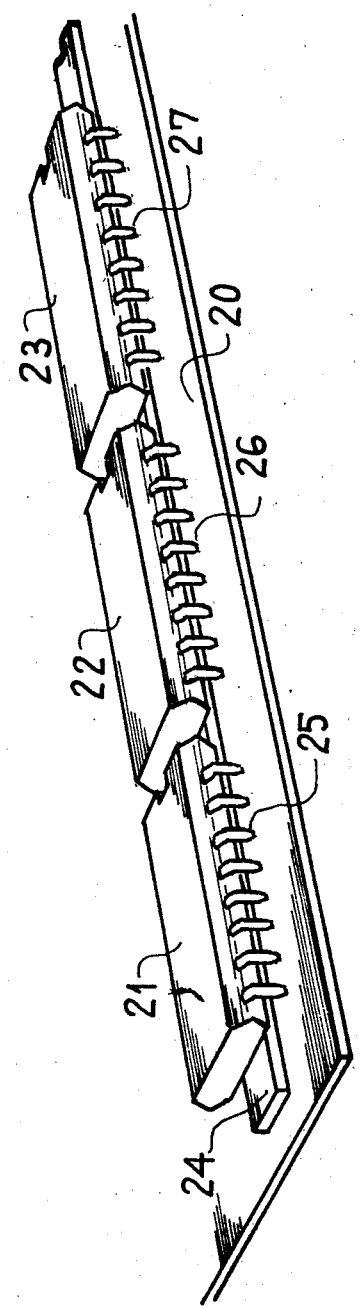

POWER SUPPLY BAR COMPRISING A STACK OF 2 N METAL LAYERS SEPARATED BY 2 N DIELECTRIC LAYERS

BACKGROUND OF THE INVENTION

The present invention relates to a bus-bar having a low impedance characteristic for transmitting an electric signal from a source to a plurality of receivers, said bus-bar comprising particularly two conducting current-conveying bars separated by dielectric means.

Such bus-bars have been used for a very long time especially in power supply systems for electric computer circuits.

Such power supply lines were designed in the past for replacing coaxial cables which are much too cumbersome in miniaturized circuits. In order to achieve the necessary decoupling between the different user circuits, connecting capacitors in parallel across the line so as to increase decoupling has already been proposed.

However, the connection of these capacitors in parallel across the lines makes very difficult the operations for maintenance thereof, as well as mounting problems.

U.S. Pat. No. 3,189,847 has already proposed using bus-bars formed from two conducting bars separated by a dielectric whose losses increase with the frequency, such as a ferromagnetic material which has the property of being conducting at low frequencies or for a DC current but which very rapidly attenuates all the high-frequency signals. Thus is avoided the propagation along the power supply bar of high-frequency pulse signals which might disturb the operation of the circuits connected to said bus-bar.

However, such a system presents the disadvantage of using a very special material, relatively expensive and having poor mechanical properties. In fact, such a ferromagnetic material is generally brittle and the power supply bars obtained in accordance with the technique described in this patent are rigid bars of relatively great thickness. Moreover, the transmission of high-frequency signals with such a bar is impossible, considering the design of this latter. More recently, U.S. Pat. No. 3,312,870 has proposed constructing power supply bars from two conducting bars separated by a dielectric material having a very high dielectric constant. The high-dielectric constant material is obtained by stacking metal plates coated with an insulating oxide film obtained by anodization, the plates being assembled together by means of an adhesive layer. Such a device is however not very easy to produce because of the anodization required for the metal plates and because of their relatively great thickness which, for high capacities, would lead to a total thickness of the power supply bars which would be unacceptable.

More recently, French Pat. No. 2,438,933 (corresponding to U.S. Pat. No. 4,236,046) has proposed using, not simply an adhesive dielectric film interposed between the power supply bars, but replacing said adhesive dielectric film by successive ceramic wafers with a high dielectric constant. An identical solution had moreover already been proposed by the patentee in U.S. Pat. No. 3,778,735. The use of high-dielectric constant ceramic material presents however the disadvantage of introducing dielectric losses and consequently a series resistance which, at high frequencies, degrades the characteristic impedance of the lines thus formed and so does not ensure good transmission of information.

All the known systems proposed up to date, such as those described above, present however different disadvantages: there exist in fact two problems to be resolved when it is desired to form bars having a low characteristic impedance and without losses at high frequencies. These bars must have the highest distributed capacity possible so as to obtain a very low characteristic impedance and to have as reduced a thickness as possible so as to take up the minimum of space in the circuits using these bars.

When it is desired for example to supply a few integrated circuits disposed on a printed circuit, the power supply bar must of course not have an excessive width compared to the width of the cases of said integrated circuits. Now, if it is desired to produce power supply bars having a very high capacity, they can be bars constructed either of great width with a single very thin dielectric film layer interposed between the power supply bars, or bars in the way described in U.S. Pat. No. 3,312,870.

In the first case, said power supply bars are too cumbersome and too fragile. In fact, the conducting bars, which are generally metallic, have a fairly rough surface condition, that is to say that there exist in places metallic projecting portions of a few microns thickness. When the two conducting bars are assembled together by means of the adhesive dielectric film, these projecting portions pierce said dielectric and the bar is short-circuited.

In the second case, the power supply bars thus formed have too great a thickness to be used in certain applications, particularly when it is desired to place said bars under the cases of type DIL integrated circuits, between the "lugs" of said integrated circuits.

Consequently, there do not exist at the present time any bars having a certain flexibility, a very low characteristic impedance and reduced thickness.

The bus-bars in accordance with the invention do not have the disadvantages of the above-described supply bars and answer the problem raised.

SUMMARY OF THE INVENTION

It is a primary object of the invention to supply a bus-bar wherein the dielectric means are formed by a stack of metal-coated dielectric films forming an assembly of 2 n identical or different dielectric films, separated by 2 n metal layers, the metal layers in even and uneven rows being respectively connected together laterally by electric connections, the conducting bars being fixed on each side of the stack and connected electrically respectively to one of the lateral electric connections. The films may be coated with metal on one or both faces. In this latter case, there will be found in the stack metal layers formed by two superimposed layers which will then be connected electrically together by contact.

Preferably, between the stack and each of the conducting bars there will be placed cushion-forming means, whose purpose is to prevent, above all, damage to the layers of the stack. Preferably, the thickness of said cushions will be greater than or equal to 10 microns. These cushions may be formed either from an adhesive such as an epoxy bonding agent, an isocyanate, a polyurethane or a mixture thereof with their respective hardners (single or dual-component bonding agents), this adhesive being insulating with respect to the conductor, or from an electrically inactive layer, formed from a flexible dielectric film.

The cushion-forming means may play a double role, on the one hand allowing assembly between the stack of dielectric films and the conducting bars, and on the other hand avoiding direct contact between the metal-coated films and said conducting bars, so as to avoid mechanical damage of one by the other. To this end, an adhesive will be preferably used which depending on circumstances, for example the shape of the power supply bar produced, will be insulating or conducting.

As conducting adhesive, conducting varnishes may be used or conducting bonding agents. The conducting nature of these varnishes or bonding agent is generally determined by the presence therein of a metal powder in a fairly large amount. Generally, the metal powder is silver, known for its very good conducting properties.

As far as the insulating bonding agents are concerned, any known type known to a man skilled in the art may be used, either single- or dual-component agents. In particular the bonding agents of the polyurethane and/or epoxy type may be used.

In the case where the cushion-forming means are formed by an electrically inactive layer, formed from a flexible dielectric film, this latter may be identical to or different from one of the dielectrics of the stack. It will be preferably chosen in the same family, described hereafter.

This film will be made solid with the stack either by means of an adhesive, or by means of lateral electric connections: these latter being generally obtained by projection of molten metal, the dielectric film is thus embodied in the stack by the projected metal.

The upper part of this film will be made solid with the conducting bars, generally by means of an adhesive such as has been defined above.

Generally, and if it is desired to make the bar of the invention more rigid, there may be introduced into the stack m adhesive layers, disposed between the 2 n layers of metal-coated films, m being less than or equal to 2 n−1. Depending on the result desired, m may vary from 1 to 2 n−1. The thickness of the adhesive, chosen preferably from current commercially available adhesives, such as those described above, will generally vary between 0.2 and 2 microns.

Such bus-bars present important advantages with respect to known power supply bars, including those comprising two conducting bars separated by an adhesive dielectric film. In fact, the power supply bars of the invention have the property of being self-healing.

The self-healing phenomenon is the following: when the dielectric film has defects called "conducting points", the application of a voltage to the conducting bar, i.e. the appearance of a potential difference between the two conducting bars, causes volatilization of the metal-coated armature parts opposite the conducting point, without perforation of the dielectric. Thus, the power supply bar is nevertheless usable since no short-circuit appears between the conducting bars.

On the contrary, in the case where a dielectric is used, adhesive or not, between two conducting bars playing the role of armatures, as is described in the prior art, when the dielectric presents a defect, on application of a voltage to the bar, there is perforation of the dielectric at the positions corresponding to the conducting points when the voltage becomes fairly high: there is then short-circuiting of said power supply bar. The power supply bars of the invention have then the very great advantage of increased reliability with respect to the power supply bars of the same type known up to present.

Furthermore, since the metal-coated films used for forming the bars of the invention allow said bar to withstand a high voltage gradient, the dielectric used may have small thickness, which results in a considerable increase in capacity, that is to say that the power supply bar of the invention has a very low characteristic impedance. Within the scope of the invention dielectric film may in fact be used having a thickness of the order of 1.5 microns while having an operating voltage greater than 100 volts.

On the contrary, in the case of solid armatures, the dielectric film must have a thickness of at least 20 microns for the power supply bar to have correct reliability in use. Under these conditions, the capacity per unit of length of said bar is obviously much lower, which results in a much higher characteristic impedance and a power supply bar poorly adapted to the problem to be resolved.

The characteristic impedance of the bars of the invention remains low even at very high frequencies, contrary to those using a high-dielectric constant ceramic material. In fact, in the case of ceramic material, the high-frequency dielectric losses introduce a series resistance into the circuit which degrades the characteristic impedance of the lines thus formed.

Moreover, contrary to the known bars of the prior art, the power supply bars of the present invention may be cut to the desired length without any risk of short-circuit between the conducting bars. In fact, the presence of the cushions provides a sufficient separation between the bars.

The bus-bars of the invention may be used as will be described hereafter, either vertically, i.e. disposed between the integrated circuits of the printed card, or horizontally, i.e. under the integrated circuits between their connecting lugs.

When these power supply bars are used vertically, the conducting bars have their connections for fixing in the holes of the printed circuits, situated on the same side of a lateral electrical connection. To this end, said conducting bars will therefore be fixed on each side of the stack of metal-coated dielectric films by means of two different adhesives, the part of the conducting bar situated in the vicinity of the lateral electric connection to which it is to be connected being secured by means of an electricity-conducting adhesive, whereas the other part of the conducting bar situated opposite the electric connection to which it is not to be connected will be secured by means of an adhesive or an adhesive film which does not conduct electricity.

Preferably, so as to reinforce the mechanical strength of said power supply bars, adhesive, either conducting or nonconducting, will also be disposed inside the reentrant dihedrons formed by the power supply bars and the lateral electric connections connecting the metal-coated films together. This is particularly necessary within the dihedrons situated on the side where the conducting bar is to be connected to the printed circuit.

As dielectric film usable within the scope of the invention, any dielectric film may be used having appropriate properties, well-known to a man skilled in the art. Preferably current dielectric films will be used such as paper, polyolefins (and in particular polypropylene and polyethylene), polycarbonate, polysulfone, polystyrene, or the polyesters such as polyethylene terephthalate, these latter being generally the films preferred within the scope of the present invention (in particular because of their very high dielectric constant). Other dielectric films may also be used such as polyamide (nylon 6, nylon 6.6 . . . ), polyimide, polyamideimide, polytetrafluoroethylene, vinylidene polyfluoride films, etc. The thickness of the film used will be as small as possible, since the capacity of the bar increases when the thickness of the dielectric diminishes. This thickness will be generally less than 20 microns, and preferably less than 5 microns. A dielectric will preferably be chosen having a loss angle at 25° C. at the frequency of 1 KHz such that the tangent of this angle, generally called tangent $\delta$, is in all cases less than or equal to $2 \times 10^{-2}$ and preferably less than $5 \times 10^{-3}$.

Generally, the type of dielectric, its thickness, etc will be chosen so that a capacity per centimeter of length of the power supply bars is obtained greater than 20 nanofarads. It is in fact considered that this value is a minimum value in order to obtain power supply bars having a low distributed constant for transmitting all signals, from DC up to several hundred MHz. This is what makes the construction of these power supply bars particularly delicate.

The metal usable for coating the surface of the dielectric film will be preferably zinc, aluminium, silver, gold or copper. The thickness of the metal film deposited on the dielectric film will be such that the "square" resistance of the metal-coated film varies between 0.5 ohm and 5 ohms. By "square" resistance is meant the resistance of a square of the metal layer having, for example, a side one centimeter long.

In fact, beyond a square resistance of 5 ohms, it has been discovered that the metal deposit is so thin that inequalities occur in the distribution of the metal, said inequalities generating important defects in the power supply bars obtained with these films. For a square resistance less than 0.5 ohm, it is generally considered that the thickness of the metal deposit is too great to make the construction of power supply bars economically advantageous by these processes. Moreover, a thick deposit is difficult to form and the power supply bar obtained with a thick deposit loses its self-healing capability.

The conducting bars will generally be formed from a highly conducting material such as copper. Preferably, this conducting material will be covered with a layer of tin, deposited before or after cutting out said bars. This tinning will be formed, in a way known per se, either chemically or electrolytically. The thickness of the tin layer will be preferably 20 microns. When this tinning is carried out before cutting out the bars, it has been discovered that the tin layer creeps during the cutting and thus protects the lateral edge of the conducting bar.

In practice, power supply bars will generally be formed comprising between four and twenty layers of metal-coated dielectric film, the other elements of the bar being chosen so that the total thickness thereof remains less than 3 mm. These particulars correspond to the best embodiment of the invention.

In order to construct the power supply bars in accordance with the invention, the stack of metal-coated dielectric films is first of all formed and assembled by lateral projection of metal. This technique is itself well-known and described for example in French Pat. No. 903,040. The stacks thus formed are then cut to the desired length and assembled with the corresponding conducting bars. These latter may be in the form of rolls which are unrolled during assembly with the dielectric stacks, each bar being previously coated with a layer of bonding agent at the desired positions, for example by means of a drum having a silk screen which allows continuous depositing of the bonding agent by silk-screen printing. So as to obtain the viscosities required for using the silk-screen printing process, the viscosity of the bonding agents used will be adjusted by dilution to a greater or lesser degree in an appropriate solvent. After pressure assembly of the stacks and the bars for a sufficient period of time to allow curing of the bonding agent, the power supply bars of the invention are then ready for use.

The bars thus formed may however, if that proves necessary, be coated with an appropriate resin. This protection may also be a paint, a plastic or adhesive thermostrip, etc.

BRIEF DESCRIPTION OF THE DRAWINGS

The invention will be better understood from the following examples, which is no wise constitute a limitation, in conjunction with the figures which show:

FIG. 5 shows an example of using a bar such as is described in FIGS. 3 and 4a, 4b implanted in a printed circuit between the integrated circuit connecting lugs.

DESCRIPTION OF THE PREFERRED EMBODIMENTS

Figure 1:
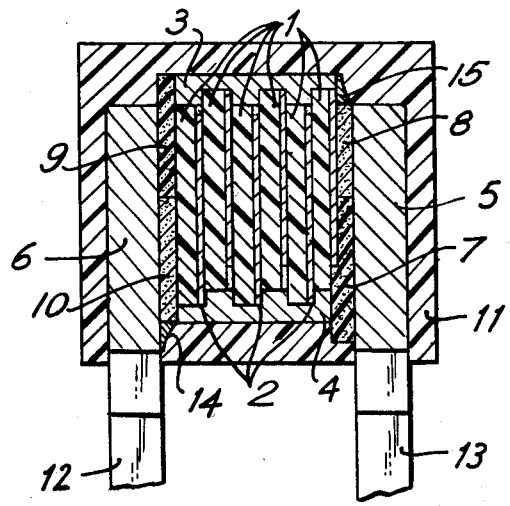
FIG. 1, a cross-sectional view of a first embodiment of the power supply bars of the invention, corresponding to a vertical position of the bar and taken along the line 1—1 of FIG. 2b.

In FIG. 1, the dielectric films 1 coated respectively with metal layers 2 are offset with respect to each other, the layers of the same row (even and uneven) being connected together by lateral electric connections such as 3 and 4. The conducting bars 5 and 6 are assembled on each side of the stack of metal-coated dielectric films by means of insulating adhesive layers such as 7 and 9, and conducting adhesive layers such as 8 and 10. It can be seen in this figure that, so as to provide a better electrical contact between the lateral electrical connections 3 and 4 and the adhesive layers 8 and 10, these latter end in menisci 14 and 15 which correspond to filling the re-entrant dihedrons formed by the lateral electrical connections 3 and 4 and the power supply bars 5 and 6.

In this figure, the whole of the conducting bar, except for the connecting lugs 12 and 13, has been embedded in resin 11.

Figure 2A:
FIG. 2a is an end view and FIG. 2b a perspective view of the power supply bar of FIG. 1.
Figure 2B:
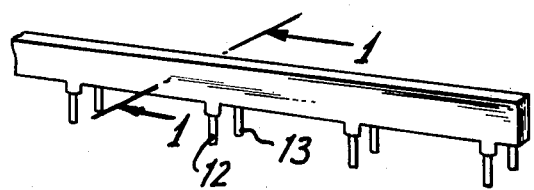

In FIG. 2a there is shown a power supply bar substantially to the actual size. In FIG. 2a, this bar is seen from the front with its connecting lug assemblies 12 and 13, whereas FIG. 2b shows a perspective view of the bar. The configuration of the bar shown in FIGS. 1 and 2a, 2b corresponds to the so-called "vertical" configuration of said bar.

Figure 3:
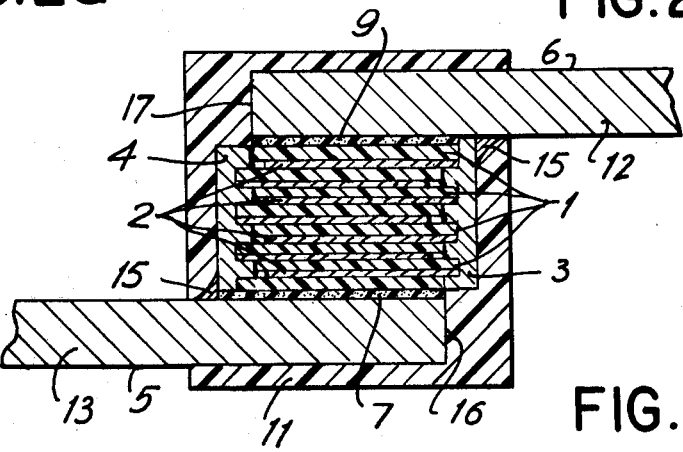
FIG. 3 shows a cross-sectional view of a second embodiment of the invention, corresponding to a horizontal position of the bar and taken along the line 3—3 of FIG. 4b.

In FIG. 3 there is shown a second embodiment of the power supply bars in accordance with the invention, corresponding to the so-called "horizontal" configuration. In this figure, the same elements as those of the preceding figures bear the same reference numerals. With respect to FIG. 1, the only difference in this FIG. 3 is formed by the arrangement of conducting bars 5 and 6. These conducting bars have their respective connecting lugs 12 and 13 situated on the same side as the lateral electric connections 3 and 4 to which they are respectively connected. In this configuration, the use of insulating bonding agents may be avoided being necessary. In this case, it is sufficient to connect the conducting bars in the configuration shown in the figure, by taking care to avoid electric contact between the bars and the lateral electric connections 3 and 4. To this end, the upper parts 16 and 17 of the conducting bars are situated approximately at the same height as the metal-coated dielectric film edges to which they are connected.

Figure 4A:
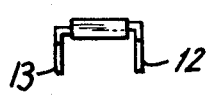
FIG. 4a is an end view and FIG. 4b a perspective view of a bar in accordance with FIG. 3.
Figure 4B:
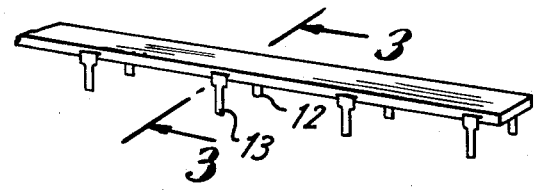

In FIG. 4a there is shown a view to approximately actual size of a power supply bar such as described in FIG. 3. This power supply bar has a very flat shape, which allows it to be used in particular as is shown in FIG. 5 for supplying integrated circuits such as 21, 22, 23 disposed on a printed card 20. In such a configuration, the supply bar 24 conforming to the one described in FIGS. 3 and 4a, 4b may be housed between the connecting lugs such as 25, 26 and 27 of said integrated circuits. Such an arrangement is readily obtainable because of the structure of the bars of the invention.

EXAMPLE

A film of polyethylene terephthalate, having a relative dielectric constant of 3.2, is coated with a vacuum-deposited layer of aluminium of a thickness substantially equal to 200 angstrom, representing a square resistance of about 1.5 ohm. This film is cut into strips of about 5 mm width. On each of these strips a small margin has been provided by removing the metal layer on one of the sides. Then the stack of metal-coated films is formed according to the technique described in French Pat. No. 903,040, then the lateral electrical connections are formed by metal projection. After cooling, the stacks thus formed are cut into pieces of about 20 cm in length. Two copper metal bars having lateral connecting lugs evenly spaced over their length, and previously tinned, are then assembled together with the above-formed stacks. To achieve this assembly, the metal bars are covered by silk-screen printing with a single-component conducting epoxy bonding agent comprising 60% pure silver. After drying and curing of the bonding agent, the power supply bar is then subjected to the marking operation and is ready for use.

Electrical measurements effected on this bar gave the following results:

Insulating resistance under 10 volts: 75,000 Megohms (measurement carried out in accordance with norm NFC 93 050 Article 1).

Capacity of the bar measuring 23 cm in length: 690 nanofarads.

Voltage behavior (in accordance with norm NFC 93 050 Article 2): a voltage of 100 volts was applied between the two conducting bars through connections, for one minute on six samples subjected to this test, no dielectric perforation nor discharge phenomenon nor sputtering was observed during the whole period of the test. In other words, no defect appeared during this test. The insulating resistance after this test remains generally substantially equal to that of the sample before testing.

The measurement of the resistance per unit of length of the power supply bar of the invention, for the six samples previously used, is between 0.21 and 0.22 milliohms per centimeter. With the copper used having a resistivity of 0.017 ohm×square millimeter per millimeter, the theoretical resistance of these bars is equal to 0.21 milliohm per centimeter. It is then quite remarkable that the power supply bars of the invention do not cause disturbances in the value of the resistance of the conducting bars used.

Finally, the characteristic impedance of the bars measured by means of a pulse generator with a rise time less than 5 nanoseconds, showed an average characteristic impedance over the six samples mentioned above equal to 0.31 ohm, the corresponding theoretical calculated value being 0.22 ohm.

It can then be seen that the lines thus formed have a very low characteristic impedance, that the process for producing them causes very few losses (the measured characteristic impedance is very little different from the theoretical characteristic impedance).

By way of comparison, the characteristic impedance of products of the same type commercially available was found to be close to 2.5 ohms.

In the preceding, the term power supply bar (or bus-bar) has been generally used. It is evident that this term in no wise limits the function of these bars to a means for connecting a voltage supply source to a plurality of circuits. It designates on the contrary a means for connecting any continuous or alternating, analog or digital electric signal generator (source) to any receiver using this signal.

What is claimed is:

1. A low characteristic impedance bus-bar for transmitting an electric signal from a source to a plurality of receivers, said bus-bar comprising two conducting bars conveying the signal, separated by dielectric means formed by a stack of metal-coated dielectric films forming an assembly of 2 n dielectric films separated by 2 n metal layers, the metal layers of even and uneven rows being respectively connected together laterally by electric connections, said conducting bars being secured on each side of the stack and connected electrically respectively to one of said lateral electric connections.

2. The bus-bar as claimed in claim 1, wherein said dielectric films are metal-coated on only one face.

3. The bus-bar as claimed in claim 1, wherein said dielectric films are metal-coated on both faces.

4. The bus-bar as claimed in claim 1, wherein said conducting bars and said stack are separated by cushion-forming means.

5. The bus-bar as claimed in claim 4, wherein said cushion-forming means have a thickness greater than or equal to 10 microns.

6. The bus-bar as claimed in one of claims 4 or 5, wherein said cushion-forming means are formed by an adhesive.

7. The bus-bar as claimed in claim 6, wherein said adhesive situated in the vicinity of the electric connection to which one conducting bar is connected is an electrically conducting adhesive, whereas that situated in the vicinity of the other electric connection is insulating.

8. The bus-bar as claimed in claim 4 or 5, wherein said cushion-forming means are formed by at least one electrically inactive layer.

9. The bus-bar as claimed in claim 8, wherein one at least of the electrically inactive layers is formed by a flexible dielectric film.

10. The bus-bar as claimed in claim 9, wherein said flexible dielectric film is made solid with the films forming the stack by means of lateral electrical connections.

11. The bus-bar as claimed in claim 1, wherein said stack of metal-coated films also comprises m adhesive layers disposed between the 2 n layers of metal-coated films, with $1 \leq m \leq 2n-1$.

12. The bus-bar as claimed in claim 11, wherein each adhesive layer thickness is between 0.2 micron and 2 microns.

13. The bus-bar as claimed in claim 1, wherein said conducting bars are provided, on one of their edges, with connecting lugs evenly spread out over the whole of their length.

14. The bus-bar as claimed in claim 1, wherein said dielectric film is selected from a material from the group consisting of paper, polyesters, polyolefins, polycarbonate, polysulfone, polyamides, polyimides, polyamides-imides, polytetrafluoroethylene and vinylidene polyfluoride.

15. The bus-bar as claimed in claim 1, wherein said metal layers are formed from a metal selected from the group consisting of aluminum, zinc, silver, gold and copper.

16. The bus-bar as claimed in claim 1, wherein the number of dielectric film layers is between four and twenty, the total thickness of said bus-bar being less than 3 mm.

* * * * *